United States Patent [19]
Lin

[11] Patent Number: 5,897,374
[45] Date of Patent: Apr. 27, 1999

[54] VERTICAL VIA/CONTACT WITH UNDERCUT DIELECTRIC

[75] Inventor: Yung-Fa Lin, Hsinchu, Taiwan

[73] Assignee: Taiwan Semiconductor Manufacturing Company, Ltd., Hsin-Chu, Taiwan

[21] Appl. No.: 08/869,021

[22] Filed: Jun. 4, 1997

Related U.S. Application Data

[63] Continuation of application No. 08/445,933, May 22, 1995, abandoned.

[51] Int. Cl.$^6$ .................................................. H01L 21/44
[52] U.S. Cl. ........................... 438/666; 438/701; 438/673
[58] Field of Search ..................................... 438/666, 640, 438/673, 701

[56] References Cited

U.S. PATENT DOCUMENTS

| | | | |
|---|---|---|---|
| 4,943,539 | 7/1990 | Wilson et al. | 437/195 |
| 4,997,789 | 3/1991 | Keller et al. | 437/192 |
| 5,204,286 | 4/1993 | Doan | 437/195 |
| 5,231,053 | 7/1993 | Bost et al. | 437/190 |
| 5,336,371 | 8/1994 | Chung et al. | 156/659.1 |
| 5,413,962 | 5/1995 | Lur et al. | 437/195 |
| 5,439,848 | 8/1995 | Hsu et al. | 437/195 |
| 5,444,020 | 8/1995 | Lee et al. | 437/195 |
| 5,444,022 | 8/1995 | Gardner | 437/195 |
| 5,470,790 | 11/1995 | Myers et al. | 437/192 |
| 5,637,534 | 6/1997 | Takeyasu et al. | |

OTHER PUBLICATIONS

T. Hasegawa, et al. "Via Filling on Al Films by Selective CVD W Using Al Isotropic Etching" Extended Abstracts, Japan Soc. of Appl. Phys. $52^{nd}$ Fall Meeting p. 718, Oct. 1991.

IBM Tech. Discl. Bull. vol. 34 No. 4B p. 288. "Rooted Refractory Metal On Al–Cu . . . ", Sep. 1991.

Hisako Ono, et al. "Development of a Planarized Al–Si Contact Filling Technology" Proc. 7th International IEEE VLSI Multilevel Interconnect Conf. (1990) pp. 76–82.

*Primary Examiner*—Caridad Everhart
*Attorney, Agent, or Firm*—George O. Saile; Stephen B. Ackerman; Rosemary L. S. Pike

[57] ABSTRACT

A new method of metallization of an integrated circuit is described. A dielectric layer is provided over a first conducting layer over an insulating layer over a semiconductor substrate. The dielectric layer is covered with a layer of photoresist which is patterned to provide a photoresist mask. At least one via hole is etched through the dielectric layer to the first conducting layer. The photoresist mask is removed. The via hole is etched through the first conducting layer resulting in an undercutting of the dielectric layer. The exposed surfaces of the first conducting layer are cleaned. The insulating layer overhang protects the exposed surfaces from damage or contamination. A second conducting layer is deposited over the surface of the dielectric layer and within the via hole completing the metallization in the fabrication of the integrated circuit.

37 Claims, 2 Drawing Sheets

VERTICAL VIA/CONTACT WITH UNDERCUT DIELECTRIC

This application is a continuation of application Ser. No. 08/445,933, filed May 22, 1995, now abandoned.

BACKGROUND OF THE INVENTION

(1) Field of the Invention

The invention relates to a method of metallization of an integrated circuit device, and more particularly, to a metallization method with improved interface area and interface mechanical properties in the manufacture of an integrated circuit device.

(2) Description of the Prior Art

In the fabrication of integrated circuit devices, metal layers make contact to lower conductive layers of the integrated circuit through vias in an insulating layer. Referring to FIG. 1, there is shown a contact of the prior art. A via or contact opening has been made through insulating layer 16 to lower conductive layer 14 on a semiconductor substrate. Top metal layer 20 contacts the top side of the bottom conductive layer 14. Some disadvantages of the conventional contact are the small interface area between the conductors and severe surface damage, residue, or contamination to the top side of the bottom conductive layer contacted by the top metal layer.

U.S. Pat. No. 5,231,053 to Bost et al shows etching a via hole into a trimetal layer and forming a tungsten plug within the via hole. U.S. Pat. No. 4,997,789 to Keller et al shows etching through an Aluminum layer, then filling the hole, and overlaying with tungsten.

SUMMARY OF THE INVENTION

A principal object of the present invention is to provide an effective and very manufacturable method of metallization in the manufacture of an integrated circuit with increased conductor-to-conductor interface area.

Another object of the invention is to provide a method of metallization with reduced contact interface damage, residue, or contamination.

A further object is to provide a method of metallization with improved interface mechanical properties between conductors.

In accordance with the objects of this invention a new method of metallization of an integrated circuit is achieved. A dielectric layer is provided over a first conducting layer over an insulating layer over a semiconductor substrate. The dielectric layer is covered with a layer of photoresist which is patterned to provide a photoresist mask. At least one via hole is etched through the dielectric layer to the first conducting layer. The photoresist mask is removed. The via hole is etched through the first conducting layer resulting in an undercutting of the dielectric layer. The exposed surfaces of the first conducting layer are cleaned. The insulating layer overhang protects the exposed surfaces from damage or contamination. A second conducting layer is deposited over the surface of the dielectric layer and within the via hole completing the metallization in the fabrication of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 2:
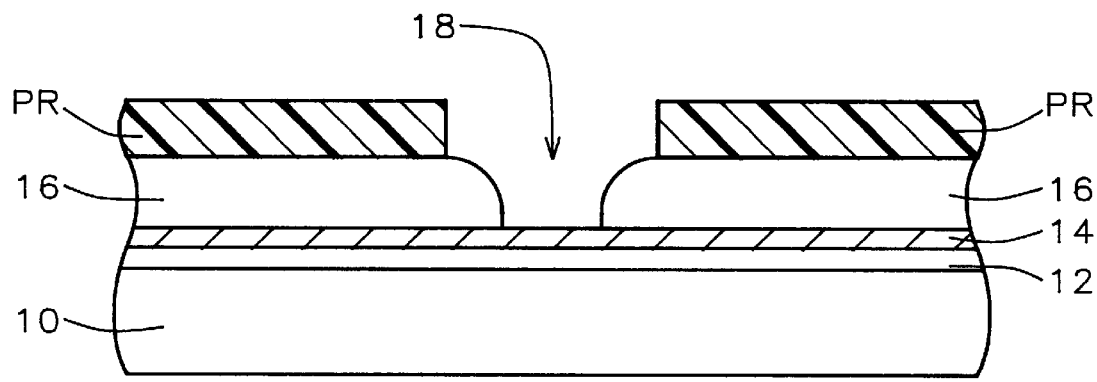
FIGS. 2 through 6 schematically illustrate in cross-sectional representation a preferred embodiment of the present invention.

Referring now to FIG. 2, there is shown a portion of a partially completed integrated circuit. The semiconductor substrate 10 is preferably composed of monocrystalline silicon. Semiconductor device structures, such as gate electrodes and source and drain regions, not shown, are formed in and on the semiconductor substrate and are included within the region labeled 10. An insulating layer 12, preferably composed of silicon oxide formed using tetraethoxysilane (TEOS), borophosphosilicate glass (BPSG), or the like, is deposited to a thickness of between about 5000 to 10,000 Angstroms over the semiconductor device structures.

A first conducting layer 14 is deposited over the insulating layer 12 to a thickness of between about 4000 to 7000 Angstroms. The conducting layer 14 may be composed of a barrier metal layer such as titanium and titanium nitride or titanium tungsten, the contact metal layer such as aluminum, AlSiCu, or AlCu, and an anti-reflective coating (ARC) layer such as titanium nitride.

An intermetal dielectric layer 16 is deposited over the first conducting layer 14. The dielectric layer may be composed of silicon oxide formed by plasma enhanced chemical vapor deposition of oxide or TEOS, cured spin-on-glass, or the like and has a thickness of between about 5000 to 10,000 Angstroms. A layer of photoresist is coated over the dielectric layer and patterned to form a photoresist mask, not shown.

A via 18 is etched through the dielectric layer to the surface of the first conducting layer using a $CF_4$ or $CHF_3$ based plasma, for example.

Figure 3:
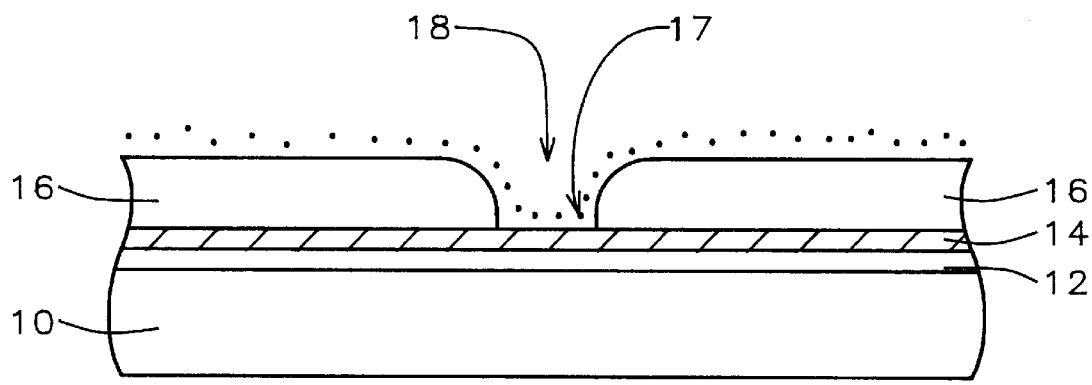

Referring to FIG. 3, the photoresist mask is stripped using oxygen plasma and an amine based net strip. The photoresist stripping results in polymer residue and surface damage to the exposed conducting layer 17. The polymer residue is a byproduct of the interaction between the oxygen plasma and the photoresist material.

Figure 4:
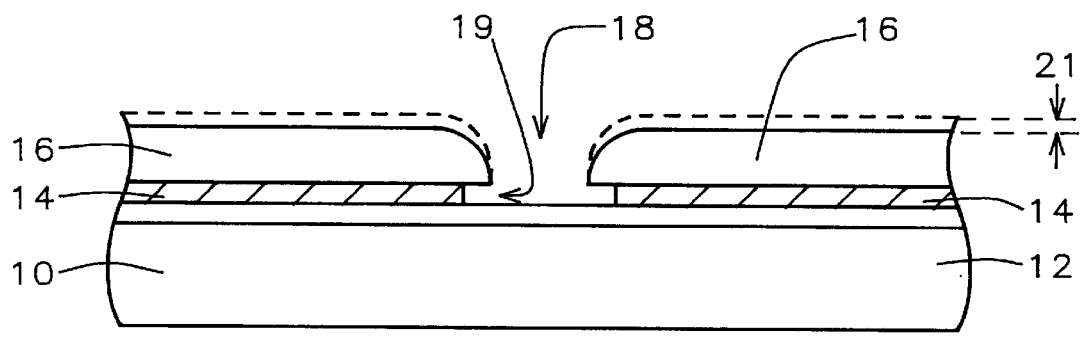

The key vertical via/contact of the invention will now be described, referring to FIG. 4. The via opening 18 is extended into the first conducting layer 14. An isotropic plasma etch using, for example, a $Cl_2$ or $CF_4$ base such as Applied Materials 8330 at low power of between about 20 to 100 watts can etch away all components of metal layer 14, including the barrier layer and ARC. The purpose of the isotropic plasma etch is two-fold. First, the etching must stop at the insulating layer 12. An anisotropic etch could go into or through the insulating layer. Secondly, an undercut 19 is formed under the dielectric layer 16. This increases the diameter of the contact and thus increases the area of the contact between the first and second conducting layers. The undercutting also provides a protection for the sidewalls of the via during the subsequent cleaning process.

Since the photoresist mask has been removed before the conducting layer 14 is etched, no polymer buildup occurs on the conducting layer during etching. A side effect of the isotropic plasma etch is the removal of the polymer residue 17 and the loss 21 of less than about 100 Angstroms of the dielectric thickness. The wafer is now cleaned using dionized water.

Figure 5:
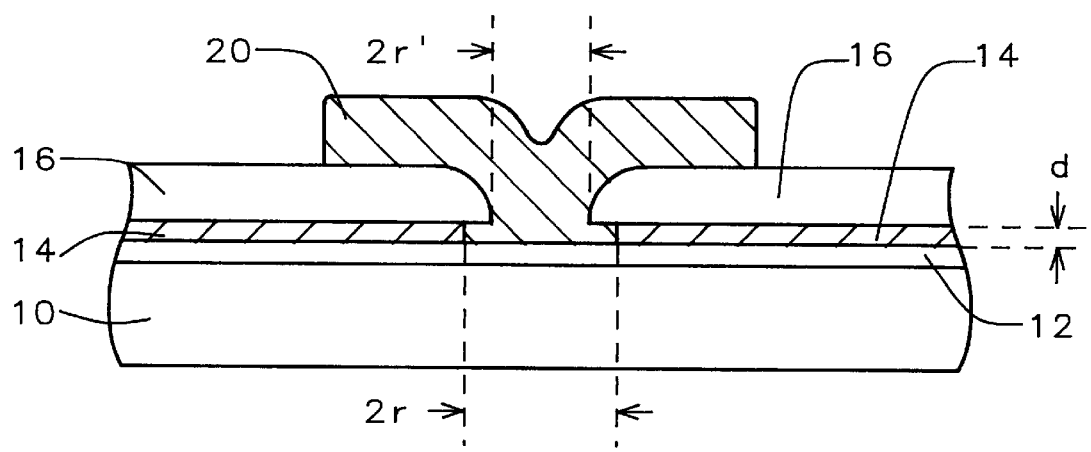
Figure 6:
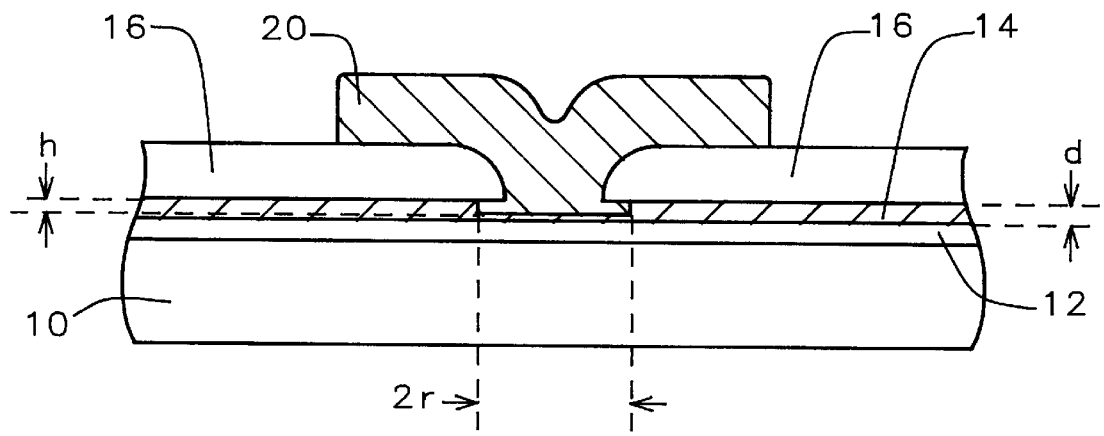

The second conducting layer 20 is now deposited to fill the via hole. This layer must be composed of aluminum or AlCu or AlSiCu and flowed at a temperature of between about 400 to 600° C. to fill the via hole under the undercut. The conducting layer 20 is patterned to complete the metallization. FIG. 5 illustrates a vertical via/contact in which the via hole is etched completely through the first conducting layer to the insulating layer surface. FIG. 6 illustrates a vertical via/contact in which the via hole is etched partially through the first conducting layer leaving a portion of the first conducting layer beneath the via hole.

Figure 1:
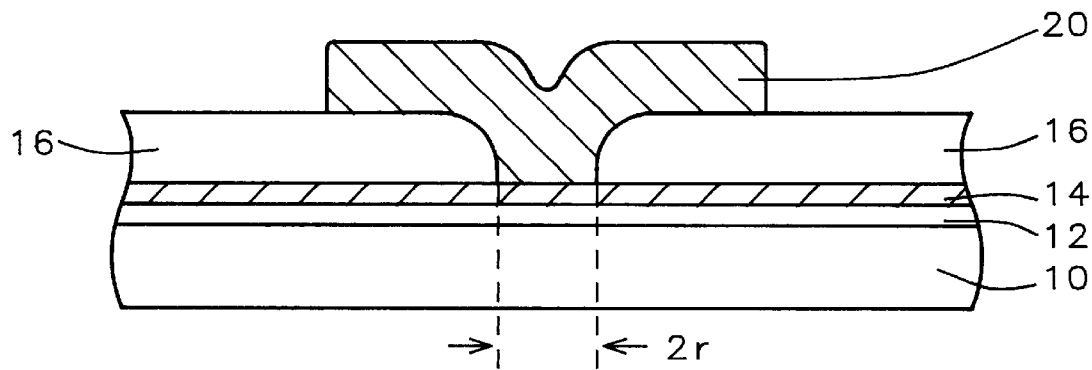
FIG. 1 schematically illustrates in cross-sectional representation a contact of the prior art.

A major advantage of the vertical via/contact structure of the present invention is increased interface area between the conductors. The diameter of the contact is 2r, shown in FIG. 1 of the prior art and in FIGS. 5 and 6. The interface area of the prior art contact is $\pi r^2$. The interface area of the partially etched out vertical via/contact illustrated in FIG. 6, where h<d, is $2\pi rh + \pi r^2$. The interface area of the completely etched out vertical via/contact illustrated in FIG. 5, is $2\pi rd$, which is greater than the prior art contact when 2d>r. In general, the damage, residue, or contamination is always on the top side of the first conducting layer in a via/contact. The lateral sides of the vertical via/contact structure do not have this problem. Thus, the process of the invention provides for removing the damaged top surface of the first conducting layer and does not allow for further damage, such as by ion bombardment or oxidation, to the conducting layer before the second conducting layer is deposited. Also, there is no polymer residue remaining on the surface of the first conducting layer. The process of the invention improves the mechanical properties of the interface between the two conducting layers because of the increased contact surface area and the absence of residue or damage on the surface of the first conducting layer.

EXAMPLE

The following Example is given to show the important features of the invention and to aid in the understanding thereof. Variations may be made by one skilled in the art without departing from the spirit and scope of the invention.

An example is given for 0.5 micron technology. As seen in FIG. 5, 2r' is the size of the opening in the dielectric layer. 2r is the size of the undercut via opening. If $2r'=0.5\mu$, $2r=0.6\mu$, $d=0.5\mu$, and h=d, then the prior art contact interface area=$\pi(0.25)^2=0.2\mu$ and the vertical via/contact interface area of the present invention=$2n(0.6)^2(0.5)=0.9\mu$. The interface area of the present invention is more than four times that of the prior art.

While the invention has been particularly shown and described with reference to the preferred embodiments thereof, it will be understood by those skilled in the art that various changes in form and details may be made without departing from the spirit and scope of the invention.

What is claimed is:

1. A method of metallization of an integrated circuit comprising:
   providing a first conducting layer over an insulating layer on the surface of a semiconductor substrate wherein said first conducting layer comprises an anti-reflective coating overlying a contact metal layer overlying a barrier metal layer;
   forming a dielectric layer overlying said first conducting layer;
   covering said dielectric layer with a layer of photoresist and patterning said photoresist to provide a photoresist mask;
   etching at least one via hole through said dielectric layer to said first conducting layer;
   removing said photoresist mask;
   extending said via hole downward through said first conducting layer to said insulating layer wherein an undercut is formed under said intermetal dielectric layer overlying said first conducting layer wherein portions of said first conducting layer are exposed;
   cleaning the exposed portions of said first conducting layer; and
   depositing a second conducting layer over the surface of said dielectric layer and within said via hole wherein said second conducting layer contains aluminum completing said metallization in the fabrication of said integrated circuit.

2. A method according to claim 1 wherein said semiconductor substrate comprises semiconductor device structures in and on a semiconductor substrate.

3. A method according to claim 1 wherein said etching through said dielectric layer is a $CF_4$ plasma etching.

4. A method according to claim 1 wherein said etching through said dielectric layer is a $CHF_3$ plasma etching.

5. A method according to claim 1 wherein said extending said via hole is done by etching with an isotropic plasma etch.

6. A method according to claim 5 wherein said isotropic plasma etch is done using a C12/CF4 base and is performed at a low power of between about 20 to 100 watts.

7. A method according to claim 5 wherein said removing said photoresist mask results in a polymer residue on the surface of said dielectric layer and a surface of said first conducting layer and wherein said isotropic plasma etch removes said polymer residue.

8. A method according to claim 1 wherein said undercut of said dielectric layer protects said exposed portions of said first conducting layer from polymer buildup or damage during subsequent processes.

9. A method according to claim 1 wherein said extending said via hole through said first conducting layer is a partial etch wherein a portion of said first conducting layer remains underlying said via hole.

10. A method according to claim 1 wherein said extending said via hole through said first conducting layer results in a via hole which contacts the underlying said insulating layer.

11. A method according to claim 1 wherein said exposed portions of said first conducting layer are cleaned by flushing said surfaces with deionized water.

12. A method according to claim 1 wherein said second conducting layer comprises Aluminum and wherein said Aluminum is flowed at between about 400 to 600° C. to fill said via hole.

13. A method according to claim 1 wherein said second conducting layer comprises an Aluminum alloy and wherein said Aluminum alloy is flowed at between about 400 to 600° C. to fill said via hole.

14. The method of metallization of an integrated circuit comprising:
   providing an insulating layer over semiconductor device structures in and on a semiconductor substrate;
   providing a first conducting layer over said insulating layer;
   depositing an intermetal dielectric layer over said first conducting layer;
   covering said intermetal dielectric layer with a layer of photoresist and patterning said photoresist to provide a photoresist mask;
   etching at least one via hole through said intermetal dielectric layer to said first conducting layer;
   removing said photoresist mask;

extending said via hole downward through said first conducting layer using an isotropic plasma etch wherein an undercut is formed under said intermetal dielectric layer overlying said first conducting layer and wherein portions of said first conducting layer along the sidewalls of said via hole are exposed;

cleaning said exposed portions of said first conducting layer; and depositing a second conducting layer over the surface of said intermetal dielectric layer and within said via hole wherein said second conducting layer contains aluminum completing said metallization in the fabrication of said integrated circuit.

15. A method according to claim 14 wherein said first conducting layer comprises a contact metal layer overlying a barrier metal layer.

16. A method according to claim 15 wherein said first conducting layer further comprises an anti-reflective coating layer overlying said contact metal layer.

17. The method of claim 14 wherein said etching through said intermetal dielectric layer is a $CF_4$ plasma etching.

18. A method according to claim 14 wherein said etching through said intermetal dielectric layer is a $CHF_3$ plasma etching.

19. A method according to claim 14 wherein said extending said via hole is done by etching with an isotropic plasma etch.

20. A method according to claim 19 wherein said isotropic plasma etch is done using a C12/CF4 base and is performed at a low power of between about 20 to 100 watts.

21. A method according to claim 19 wherein said removing said photoresist mask results in a polymer residue on the surface of said intermetal dielectric layer and on a top surface of said first conducting layer and wherein said isotropic plasma etch removes said polymer residue.

22. A method according to claim 14 wherein said undercut protects said exposed portions of said first conducting layer from polymer buildup or damage during subsequent processes.

23. A method according to claim 14 wherein said extending said via hole through said first conducting layer is a partial etch wherein a portion of said first conducting layer remains underlying said via hole.

24. A method according to claim 14 wherein said extending said via hole through said first conducting layer results in a via hole which contacts the underlying said insulating layer.

25. A method according to claim 14 wherein said exposed portions of said first conducting layer are cleaned by flushing said surfaces with deionized water.

26. A method according to claim 14 wherein said second conducting layer comprises Aluminum and wherein said Aluminum is flowed at between about 400 to 600° C. to fill said via hole.

27. A method according to claim 14 wherein said second conducting layer comprises an Aluminum alloy and wherein said Aluminum alloy is flowed at between about 400 to 600° C. to fill said via hole.

28. The method of metallization of an integrated circuit comprising:

providing an insulating layer over semiconductor device structures in and on a semiconductor substrate;

providing a first conducting layer over said insulating layer;

depositing an intermetal dielectric layer over said first conducting layer;

covering said intermetal dielectric layer with a layer of photoresist and patterning said photoresist to provide a photoresist mask;

etching at least one via hole through said intermetal dielectric layer to said first conducting layer whereby a surface of said first conducting layer is exposed;

removing said photoresist mask whereby a polymer residue is formed on the surface of said intermetal dielectric layer and said exposed surface of said first conducting layer;

extending said via hole downward through said first conducting layer to said insulating layer using a $Cl_2/CF_4$ isotropic plasma etch wherein an undercut is formed under said intermetal dielectric layer overlying said first conducting layer and whereby said polymer residue is removed from the surface of said intermetal dielectric layer and said exposed surface of said first conducting layer; and depositing a second conducting layer over the surface of said intermetal dielectric layer and within said via hole wherein said second conducting layer contains aluminum completing said metallization in the fabrication of said integrated circuit.

29. A method according to claim 28 wherein said first conducting layer comprises a contact metal layer overlying a barrier metal layer.

30. A method according to claim 29 wherein said first conducting layer further comprises an anti-reflective coating layer overlying said contact metal layer.

31. The method of claim 28 wherein said etching through said intermetal dielectric layer is a $CF_4$ plasma etching.

32. A method according to claim 28 wherein said etching through said intermetal dielectric layer is a $CHF_3$ plasma etching.

33. A method according to claim 28 wherein said isotropic plasma etch is done using a C12/CF4 base and is performed at a low power of between about 20 to 100 watts.

34. A method according to claim 28 wherein said undercut protects said exposed surface of said first conducting layer from polymer buildup or damage during subsequent processes.

35. A method according to claim 28 wherein said isotropic plasma etch is a partial etch wherein a portion of said first conducting layer remains underlying said via hole.

36. A method according to claim 28 wherein said isotropic plasma etch results in a via hole which contacts the underlying said insulating layer.

37. A method according to claim 28 wherein said second conducting layer comprises Aluminum and wherein said Aluminum is flowed at between about 400 to 600° C. to fill said via hole.

\* \* \* \* \*